(12) United States Patent
Kim

(10) Patent No.: US 10,811,103 B2
(45) Date of Patent: Oct. 20, 2020

(54) MEMORY CONTROLLER, MEMORY SYSTEM, AND METHOD OF OPERATING MEMORY SYSTEM

(71) Applicant: SK hynix Inc., Gyeonggi-do (KR)

(72) Inventor: Min Kee Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 122 days.

(21) Appl. No.: 16/020,100

(22) Filed: Jun. 27, 2018

(65) Prior Publication Data

US 2019/0164615 A1     May 30, 2019

(30) Foreign Application Priority Data

Nov. 30, 2017    (KR) .................. 10-2017-0163254

(51) Int. Cl.

| | |
|---|---|
| *G06F 3/00* | (2006.01) |
| *G11C 16/26* | (2006.01) |
| *G11C 16/08* | (2006.01) |
| *G06F 12/02* | (2006.01) |
| *G06F 3/06* | (2006.01) |
| *G11C 7/10* | (2006.01) |
| *G11C 8/10* | (2006.01) |
| *G06F 13/16* | (2006.01) |

(52) U.S. Cl.
CPC .............. *G11C 16/26* (2013.01); *G06F 3/061* (2013.01); *G06F 3/0656* (2013.01); *G06F 3/0659* (2013.01); *G06F 3/0679* (2013.01); *G06F 12/0246* (2013.01); *G11C 7/1015* (2013.01); *G11C 7/1051* (2013.01); *G11C 16/08* (2013.01); *G06F 13/1668* (2013.01); *G11C 8/10* (2013.01)

(58) Field of Classification Search
None
See application file for complete search history.

(56) References Cited

U.S. PATENT DOCUMENTS

| | | | | |
|---|---|---|---|---|
| 7,802,026 | B2 * | 9/2010 | Perozo | .................. G06F 3/0613 370/235 |
| 10,482,019 | B2 * | 11/2019 | Adachi | ................... G06F 3/061 |

FOREIGN PATENT DOCUMENTS

| | | |
|---|---|---|
| KR | 1020160075174 | 6/2016 |
| KR | 1020170008152 | 1/2017 |
| KR | 1020170062614 | 6/2017 |

* cited by examiner

*Primary Examiner* — Midys Rojas
(74) *Attorney, Agent, or Firm* — IP & T Group LLP

(57) ABSTRACT

Provided herein may be a memory controller, a memory system, and a method of operating the memory system. The memory controller may control the operation of a memory device. The memory controller may include a read request buffer, a command generator, and a read request monitor. The read request buffer may be configured to receive a read request from a host. The command generator may be configured to receive the read request from the read request buffer and generate a read command based on the received read request. The read request monitor may be configured to receive read request information about the read request from the read request buffer and determine, based on a stream ID of the read request, whether the read request is a sequential read request.

20 Claims, 11 Drawing Sheets

MEMORY CONTROLLER, MEMORY SYSTEM, AND METHOD OF OPERATING MEMORY SYSTEM

CROSS-REFERENCE TO RELATED APPLICATION

The present application claims priority under 35 U.S.C. § 119(a) to Korean patent application number 10-2017-0163254, filed on Nov. 30, 2017, which is herein incorporated by reference in its entirety.

BACKGROUND

1. Field of Invention

Various embodiments of the present disclosure generally relate to an electronic device. Particularly, the embodiments relate to a memory controller, a memory system, and a method of operating the memory system.

2. Description of the Related Art

Semiconductor memory devices may be classified into a volatile semiconductor memory device and a nonvolatile semiconductor memory device. A volatile semiconductor memory device is advantageous in that reading and writing may be performed at high speeds, but is disadvantageous in that stored information is lost when power supply is interrupted. In contrast, a nonvolatile semiconductor memory device may retain information stored therein even if the power supply is interrupted. Therefore, the nonvolatile semiconductor memory device is used to store information that needs to be retained regardless of whether power is supplied.

Examples of a nonvolatile semiconductor memory device may include a mask read-only memory (MROM), a programmable read-only memory (PROM), an erasable programmable read-only memory (EPROM), and an electrically erasable programmable read-only memory (EEPROM).

A representative example of a nonvolatile semiconductor memory device may include a flash memory device. A flash memory device has been widely used as an audio and video data storage medium for electronic devices, such as a computer, a mobile phone, a personal digital assistant (PDA), a digital camera, a camcorder, a voice recorder, an MP3 player, a handheld personal computer (PC), a game console, a facsimile, a scanner, and a printer.

Recently, as demand for high integration of memory devices has increased, multi-bit flash memory devices in which multiple bits are stored in a single memory cell have become popular.

A memory device may include a plurality of memory cells coupled to a single word line, and may perform a program operation which stores data in memory cells and an erase operation which erases programmed data.

SUMMARY

Various embodiments of the present disclosure are directed to a memory controller, which can improve the operating speed of a memory system.

Various embodiments of the present disclosure are directed to a memory system having an improved operating speed.

Various embodiments of the present disclosure are directed to a method of operating a memory system having an improved operating speed.

An embodiment of the present disclosure may provide for a memory controller for controlling an operation of a memory device. The memory controller may include a read request buffer configured to receive a read request from a host, a command generator configured to receive the read request from the read request buffer and generate a read command based on the received read request, and a read request monitor configured to receive read request information about the received read request from the read request buffer and determine, based on a stream ID of the received read request, whether the received read request is a sequential read request with respect to an immediately previous read request having the same stream ID as the received read request.

In an embodiment, the received read request received from the host may be a multi-stream read request.

In an embodiment, the read request monitor may be configured to, when the received read request is determined to be the sequential read request, generate a control signal for controlling the command generator to generate a read-ahead command.

In an embodiment, the command generator may be configured to generate the read-ahead command in response to the control signal and transfer the read-ahead command to the memory device, wherein the read-ahead command is configured to perform a read-look-ahead operation on data corresponding to an address consecutive to an address of the received read request.

In an embodiment, the memory controller may further include a data buffer configured to store data received from the memory device in response to the read-ahead command.

An embodiment of the present disclosure may provide for a memory system. The memory system may include a memory device configured to include a plurality of memory cells to store data, and a memory controller configured to control an operation of the memory device, wherein the memory controller is configured to receive a plurality of read requests, each including a stream ID, and determine, based on the stream IDs, whether a currently received read request of the plurality of received read requests is a sequential read request with respect to an immediately previous read request having the same stream ID as the currently received read request.

In an embodiment, when the currently received read request is determined to be the sequential read request, a read-look-ahead operation may be performed.

In an embodiment, the memory controller may be configured to compare an address of the immediately previous read request including the stream ID with an address of the currently received read request, and update a count value corresponding to the stream ID when the stream IDs of the currently received read request and the immediately previous read request are the same, and determine that the currently received read request is the sequential read request when the count value is equal to or greater than a first threshold.

In an embodiment, the memory controller may increase the count value by 1 when the address of the immediately previous read request and the address of the currently received read request are consecutive addresses.

In an embodiment, the memory controller may initialize the count value when the address of the immediately previous read request and the address of the currently received read request are not consecutive addresses.

In an embodiment, when the currently received read requests is determined to be the sequential read request, the memory system may perform a read-look-ahead operation on data stored at an address consecutive to the address of the currently received read request.

An embodiment of the present disclosure may provide for a method of operating a memory system. The method may include receiving a data read request for a memory device from a host, and determining, based on a stream ID included in the data read request, whether to perform a read-look-ahead operation.

In an embodiment, determining whether to perform the read-look-ahead operation may include updating a count value corresponding to the stream ID by referring to an immediately previous read request having a stream ID identical to that of the received data read request, determining whether the updated count value is equal to or greater than a first threshold, and performing the read-look-ahead operation based on a result of determination.

In an embodiment, updating the count value may comprise comparing an address of the immediately previous read request including the stream ID with an address of the received data read request, and then updating the count value.

In an embodiment, updating the count value may comprise increasing the count value by 1 when the address of the immediately previous read request and the address of the received data read request are consecutive addresses.

In an embodiment, updating the count value may comprise initializing the count value when the address of the immediately previous read request and the address of the received data read request are not consecutive addresses.

In an embodiment, performing the read-look-ahead operation based on the result of determination may comprise performing the read-look-ahead operation when the updated count value is equal to or greater than a first threshold.

An embodiment of the present disclosure may provide for a memory system. The memory system may include a memory device and a memory controller. The controller is configured to determine a current read request, which is provided from a host in a shuffled manner among multi-streams, as a sequential read request based on a stream ID and a read address included in the current read request. In addition, the controller is configured to perform a read-look-ahead operation on the memory device based on a number of sequential read requests. The stream ID represents one stream among the multi-streams. The controller determines the current read request as the sequential read request when the read address of current read request is consecutive to that of an immediately previous read request having the same stream ID as the current read request.

In an embodiment, the controller may control, during the read-look-ahead operation, the memory device to read data corresponding to the read address consecutively subsequent to that of the current read request. The controller may buffer the read data.

In an embodiment, the controller may provide, during the read-look-ahead operation, the buffered data to the host when the controller determines a read request subsequent to the current read request as the sequential read request having the information of the same stream ID as the current read request.

DETAILED DESCRIPTION

Figure 1:
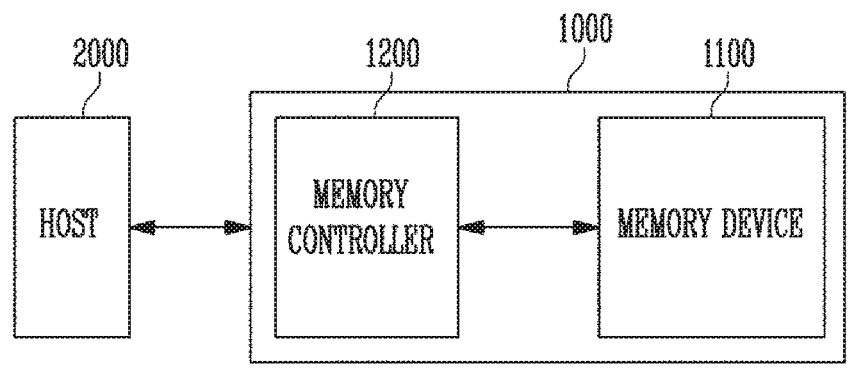
FIG. 1 is a diagram illustrating a memory system according to an embodiment of the present disclosure.

Advantages and features of the present disclosure, and methods for achieving the same are described below in connection with embodiments and with reference to the accompanying drawings. However, the present disclosure is not limited to the following embodiments but may be embodied in other forms. Accordingly, these embodiments are provided so that the present disclosure is thorough and complete and fully conveys the technical spirit of the disclosure to those skilled in the art. It is further noted that reference below to "an embodiment" is not necessarily to only one embodiment, and different references to "an embodiment" are not necessarily to the same embodiment(s).

It is also noted that in this specification, "connected/coupled" refers to one component not only directly coupling another component but also indirectly coupling another component through one or more intermediate components. In the specification, when an element is referred to as "comprising" or "including" a component, that does not preclude inclusion of one or more additional components unless the context clearly indicates otherwise.

Regarding the drawings, the same reference numerals are used throughout the different drawings to designate the same or similar components. Details of well-known configurations and functions may be omitted to avoid unnecessarily obscuring inventive aspects and features of the present disclosure.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention.

As used herein, singular forms may include the plural forms as well and vice versa, unless the context clearly indicates otherwise.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to the attached drawings.

FIG. 1 is a diagram illustrating a memory system 1000 according to an embodiment of the present disclosure.

Referring to FIG. 1, the memory system 1000 may include a memory device 1100 for storing data and a memory controller 1200 for controlling the memory device 1100 under the control of a host 2000.

The host 2000 may communicate with the memory system 1000 using an interface protocol such as a peripheral component interconnect-express (PCI-E), an advanced technology attachment (ATA), a serial ATA (SATA), a parallel ATA (PATA) or a serial attached SCSI (SAS). However, the interface protocol of data communication between the host 2000 and the memory system 1000 is not limited to the above examples. Rather, an interface protocol such as a Universal Serial Bus (USB), a Multi-Media Card (MMC), an Enhanced Small Disk Interface (ESDI), or Integrated Drive Electronics (IDE) may be used.

The memory controller 1200 may control overall operation of the memory system 1000 and may control data exchange between the host 2000 and the memory device 1100. For example, the memory controller 1200 may program or read data by controlling the memory device 1100 in response to a request from the host 2000. Further, the memory controller 1200 may store information of main memory blocks and sub-memory blocks included in the memory device 1100, and may select the memory device 1100 so that a program operation is performed on a main memory block or a sub-memory block depending on the amount of data that is loaded for the program operation. In an embodiment, examples of the memory device 1110 may include a double data rate synchronous dynamic random access memory (DDR SDRAM), a low power double data rate 4 (LPDDR4) SDRAM, a graphics double data rate SDRAM (GDDR SDRAM), a low power DDR (LPDDR) SDRAM, a Rambus dynamic random access memory (RDRAM) or a flash memory.

The memory device 1100 may perform a program operation, a read operation, or an erase operation under the control of the memory controller 1200.

Figure 2:
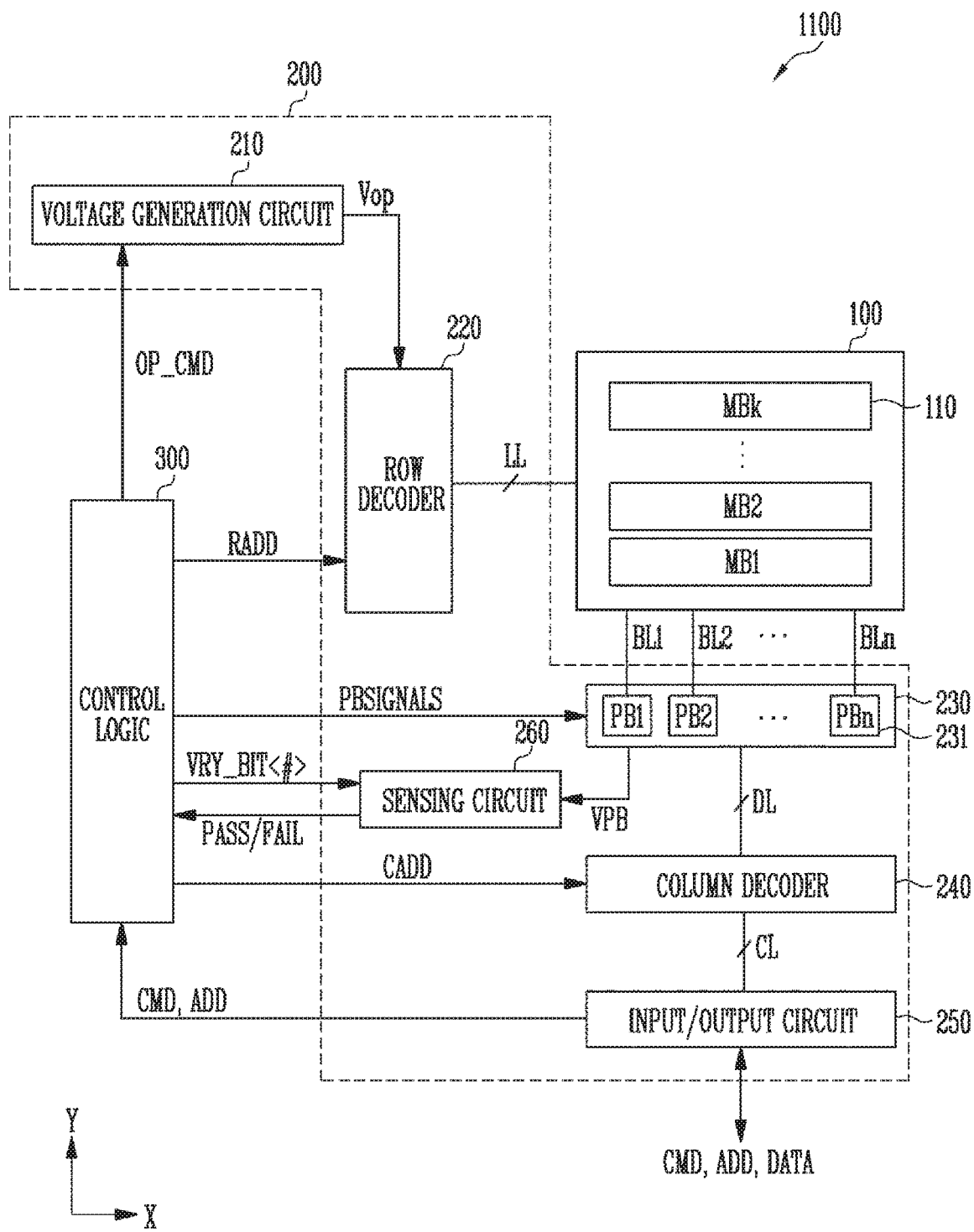
FIG. 2 is a diagram illustrating a memory device of FIG. 1.

FIG. 2 is a diagram illustrating the memory device 1100 of FIG. 1.

Referring to FIG. 2, the memory device 1100 may include a memory cell array 100 in which data is stored. The memory device 1100 may also include peripheral circuits 200, which perform a program operation for storing data in the memory cell array 100, a read operation for outputting stored data, and an erase operation for erasing stored data. The memory device 1100 may include a control logic 300, which controls the peripheral circuits 200 under the control of a memory controller (e.g., 1200 of FIG. 1).

The memory cell array 100 may include a plurality of memory blocks MB1 to MBk 110 (where k is a positive integer). Local lines LL and bit lines BL1 to BLn (where n is a positive integer) may be coupled to each of the memory blocks MB1 to MBk 110. For example, the local lines LL may include a first select line, a second select line, and a plurality of word lines arranged between the first and second select lines. Further, the local lines LL may include dummy lines arranged between the first select line and the word lines and between the second select line and the word lines. Here, the first select line may be a source select line, and the second select line may be a drain select line. For example, the local lines LL may include word lines, drain and source select lines, and source lines SL. For example, the local lines LL may further include dummy lines. For example, the local lines LL may further include pipelines. The local lines LL may be coupled to the memory blocks MB1 to MBk 110, respectively, and the bit lines BL1 to BLn may be coupled in common to the memory blocks MB1 to MBk 110. The memory blocks MB1 to MBk 110 may be implemented as a two-dimensional (2D) or a three-dimensional (3D) structure. For example, the memory cells in the memory blocks 110 having a 2D structure may be arranged horizontally on a substrate. For example, memory cells in the memory blocks 110 having a 3D structure may be stacked vertically on the substrate.

The peripheral circuits 200 may perform a program, read, or erase operation on a selected memory block 110 under the control of the control logic 300. For example, the peripheral circuits 200 may supply a verify voltage and pass voltages to the first select line, the second select line, and the word lines, may selectively discharge the first select line, the second select line, and the word lines, and may verify memory cells coupled to a word line selected from among the word lines, under the control of the control logic 300. For example, the peripheral circuits 200 may include a voltage generation circuit 210, a row decoder 220, a page buffer group 230, a column decoder 240, an input/output circuit 250, and a sensing circuit 260.

The voltage generation circuit 210 may generate various operating voltages Vop used for program, read, and erase operations in response to an operation signal OP_CMD. Further, the voltage generation circuit 210 may selectively discharge the local lines LL in response to the operation signal OP_CMD. For example, the voltage generation circuit 210 may generate a program voltage, a verify voltage, pass voltages, a turn-on voltage, a read voltage, an erase voltage, a source line voltage, etc. under the control of the control logic 300.

The row decoder 220 may transfer the operating voltages Vop to the local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may be operated in response to page buffer control signals PBSIGNALS. For example, the page buffers PB1 to PBn 231 may temporarily store data received through the bit lines BL1 to BLn or may sense the voltages or currents of the bit lines BL1 to BLn during a read or a verify operation.

The column decoder 240 may transfer data between the input/output circuit 250 and the page buffer group 230 in response to a column address CADD. For example, the column decoder 240 may exchange data with the page buffers 231 through data lines DL or may exchange data with the input/output circuit 250 through column lines CL.

The input/output circuit 250 may transfer a command CMD and an address ADD received from the memory controller 1200 (illustrated in FIG. 1) to the control logic 300, or may exchange data DATA with the column decoder 240.

The sensing circuit 260 may generate a reference current in response to an enable bit VRY_BIT<#> and may output a pass signal PASS or a fail signal FAIL by comparing a sensing voltage VPB, received from the page buffer group 230, with a reference voltage, generated based on the reference current, during the read operation or the verify operation.

The control logic 300 may control the peripheral circuits 200 by outputting the operation signal OP_CMD, the row address RADD, the page buffer control signals PBSIG-NALS, and the enable bit VRY_BIT<#> in response to the command CMD and the address ADD. Further, the control logic 300 may determine whether a verify operation has passed or failed in response to the pass or fail signal PASS or FAIL.

Figure 3:
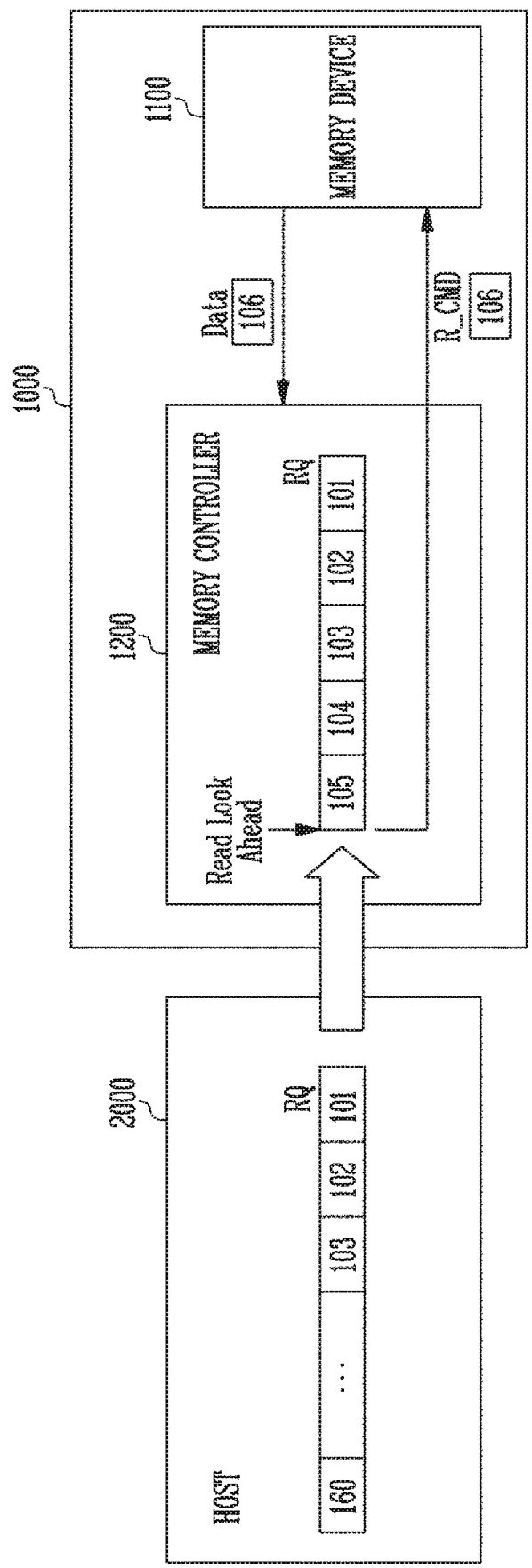
FIG. 3 is a diagram for explaining a read-look-ahead operation according to an embodiment of the present disclosure.

FIG. 3 is a diagram for explaining a read-look-ahead operation in accordance with an embodiment of the present disclosure.

Referring to FIG. 3, read requests RQ may be sequentially transferred from a host 2000 to a memory system 1000. FIG. 3 illustrates, as an example, a state in which the host 2000 sequentially transfers the read requests RQ to the memory system 1000, for pieces of data ranging from data corresponding to an address 101 to data corresponding to an address 160. That is, the host 2000 may transmit a "sequential read" request, which is a read operation on consecutive pieces of data having sequential addresses, to the memory system 1000.

The read requests RQ from the host 2000 are transferred to the memory controller 1200 in the memory system 1000. The memory controller 1200 may generate a read command based on the received read requests RQ, and may transfer the read command to the memory device 1100. The memory device 1100 may read data in response to the received read command, and may transfer the read data to the memory controller 1200. The memory controller 1200 may transmit the received data to the host 2000.

In the example of FIG. 3, the host 2000 may transmit a "sequential read" request to the memory system 1000. The memory controller 1200 may analyze a plurality of received read requests, and may perform a read-look-ahead (RLA) operation. That is, when the read requests received from the host 2000 indicate consecutive addresses, the memory controller 1200 may determine that the corresponding read requests are sequential read requests. In an example, when five read requests indicating consecutive addresses are received, the memory controller 1200 may determine that the read requests being provided from the host 2000 are sequential read requests.

In the example of FIG. 3, the memory controller 1200 receives first a data read request RQ indicating the address 101. Then, consecutive to the previously received address 101, the memory controller 1200 receives a data read request RQ indicating the address 102. When this procedure is repeated for additional consecutive addresses to the point at which the memory controller 1200 receives a data read request RQ indicating the address 105, then five data read requests RQ indicating consecutive addresses 101 to 105 have been received, and thus the memory controller 1200 may determine that the host 2000 is transmitting sequential read requests.

Accordingly, the memory controller 1200 may perform a read-look-ahead operation. That is, since the host 2000 is transmitting the sequential read requests, a read command R_CMD for an address 106 may be generated in advance and transferred to the memory device 1100 even if a data read request RQ indicating the address 106 has not yet been received. The memory device 1100 may transfer data corresponding to the received read command R_CMD to the memory controller 1200. The memory controller 1200 may store the received data in a data buffer (not illustrated), which may be disposed inside or external to the memory controller 1200. Thereafter, when the host 2000 transmits the data read request indicating the address 106, the memory controller 1200 immediately transfers the data, stored in the data buffer, to the host 2000 in response to the data read request indicating the address 106.

The memory controller 200 stores the received data in the data buffer. Thereafter, when the data read request RQ transmitted from the host 2000 is not a read request corresponding to the address 106, the memory controller 1200 may discard the data stored in the data buffer by the read-look-ahead operation.

In FIG. 3, an embodiment in which the memory controller 1200 determines that sequential read requests are being received when five read requests for data having consecutive addresses are successively received is illustrated. However, this is only an example. The number of received read requests having consecutive addresses at which it is determined that sequential read requests are being received may be set to any suitable number depending on system design considerations. In an example, the memory controller 1200 may also determine that sequential read requests are being received when ten or more read requests for data having consecutive addresses are successively received.

As described above, when the memory system 1000 performs a read-look-ahead operation in response to the sequential read requests, the overall operating speed of the memory system 1000, especially, a read operation speed may be improved.

Figure 4:
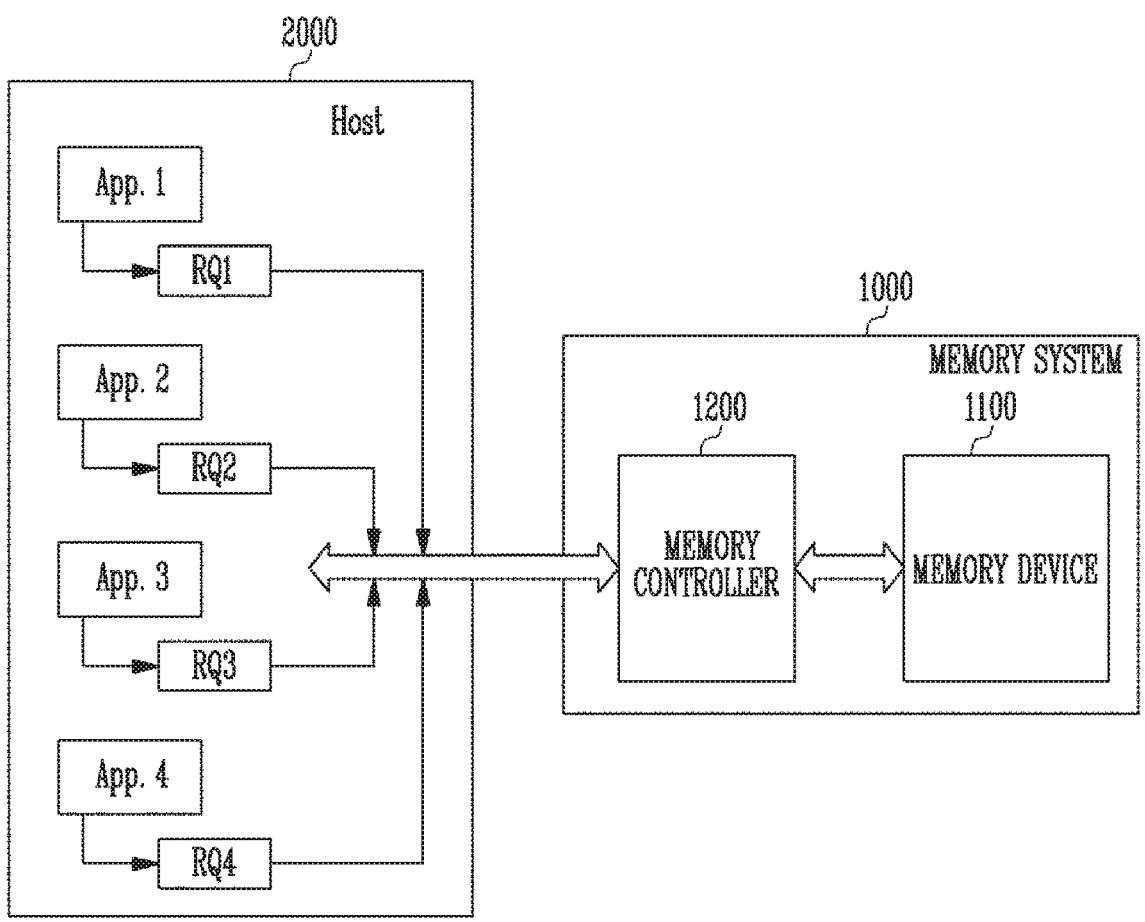
FIG. 4 is a block diagram illustrating the transmission of read requests in a multi-stream environment according to an embodiment of the present disclosure.

FIG. 4 is a block diagram illustrating the transmission of read requests in a multi-stream environment in accordance with an embodiment of the present disclosure.

Referring to FIG. 4, a plurality of read requests RQ1 to RQ4 may be transmitted to the memory system 1000 by a plurality of applications App.1 to App.4 that are internally executed in the host 2000. For example, the first application App.1 may be an application related to editing of pictures, wherein the first request RQ1 may be a read request for specific picture data stored in the memory device 1100. Further, the second application App.2 may be an application related to playing videos, wherein the second request RQ2 may be a read request for specific video data stored in the memory device 1100. In this way, in a multi-stream environment, the host 2000 may transfer read requests, generated in real time by the plurality of applications App.1 to App.4 that are internally executed, to the memory system 1000.

In this case, the read requests RQ1 to RQ4, generated by respective applications App.1 to App.4, may be shuffled and transmitted to the memory system 1000. Therefore, when the read requests generated by respective applications App.1 to App.4 are sequential read requests, there may be a situation in which the memory controller 1200 of the memory system 1000 cannot determine that the read requests generated by the applications App.1 to App.4 are sequential read requests.

In accordance with embodiments of the present disclosure, the memory controller 1200 may determine whether received read requests from the applications App.1 to App.4 are sequential read requests based on the stream IDs of read requests generated by the host 2000. Accordingly, a read-look-ahead operation may be efficiently performed even when a plurality of applications transmit shuffled sequential read requests in real time in a multi-stream environment.

Therefore, the overall operating speed of the memory system 1000, especially a read operation speed, may be improved.

A detailed method of performing a read-look-ahead operation based on stream IDs in accordance with embodiments of the present disclosure will be described with reference to FIGS. 5 to 11.

Figure 5:
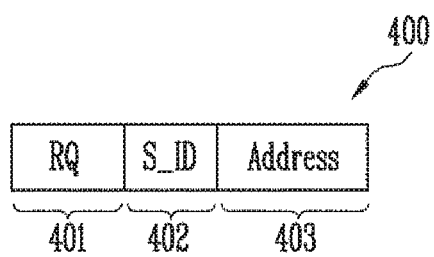
FIG. 5 is a diagram illustrating the structure of a read request message sent to a memory system according to an embodiment of the present disclosure.

FIG. 5 is a diagram illustrating the structure of a read request message sent to a memory system according to an embodiment of the present disclosure.

Referring to FIG. 5, a message 400 configuring a read request, which is to be sent from the host 2000 to the memory system 1000 in a multi-stream environment, may include three fields 401, 402, and 403. The first field 401 may indicate that the corresponding message 400 is a read request. The first field 401 may be used such that the read request is distinguished from a data program request or a data erase request. The second field 402 may indicate the stream ID of the read request configured by the corresponding message 400. Referring to FIG. 5 together with FIG. 4, an application by which the corresponding read request is generated may be identified based on the stream ID. The third field 403 may indicate an address at which target data for the read request is stored.

The format of fields in the message illustrated in FIG. 5 is only an example, and the order of the fields 401, 402, and 403 may be changed. Also, the message 400 configuring the read request may further include other fields having other purposes, in addition to the fields illustrated in FIG. 5.

The memory controller 1200 according to one or more embodiments of the present disclosure may determine, based on the stream ID S_ID contained in the message 400 illustrated in FIG. 5, whether a received read request is a sequential read request. Accordingly, a read-look-ahead operation may be efficiently performed even when a plurality of applications transmit sequential read requests in real time in a multi-stream environment. Therefore, the overall operating speed of the memory system 1000, especially a read operation speed, may be improved.

Figure 6:
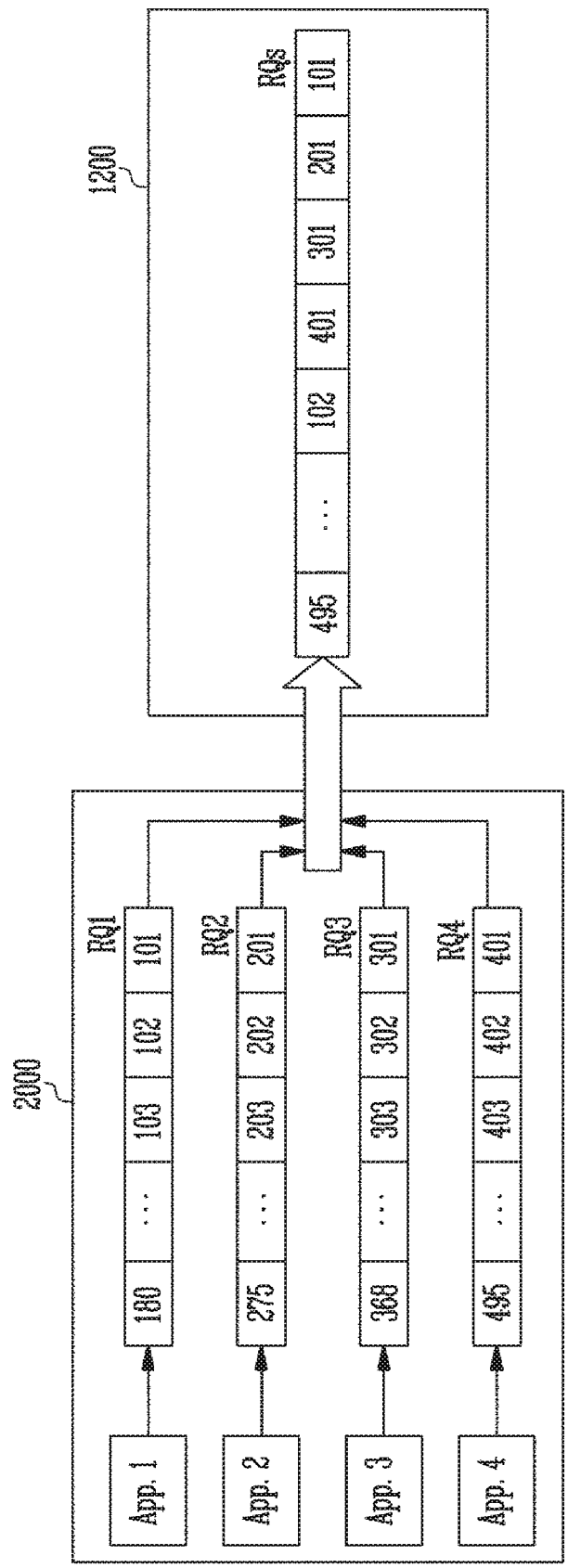
FIG. 6 is a diagram illustrating in detail the transmission of read requests in a multi-stream environment according to an embodiment of the present disclosure.

FIG. 6 is a diagram illustrating in detail the transmission of read requests in a multi-stream environment in accordance with an embodiment of the present disclosure.

Referring to FIG. 6, applications App.1 to App.4 that are executed in the host 2000 may generate their own read requests RQ1 to RQ4, respectively. The first application App.1 generates the first read request RQ1. The first read request RQ1 may be a sequential read request. As illustrated in FIG. 6, the first read request RQ1 includes data read requests corresponding to addresses 101 to 180. The second application App.2 generates the second read request RQ2. The second read request RQ2 may be a sequential read request. As illustrated in FIG. 6, the second read request RQ2 includes data read requests corresponding to addresses 201 to 275. The third application App.3 generates the third read request RQ3. The third read request RQ3 may be a sequential read request. As illustrated in FIG. 6, the third read request RQ3 includes data read requests corresponding to addresses 301 to 368. The fourth application App.4 generates the fourth read request RQ4. The fourth read request RQ4 may be a sequential read request. As illustrated in FIG. 6, the fourth read request RQ4 includes data read requests corresponding to addresses 401 to 495.

In a conventional memory system, different applications of a host may generate sequential read requests, but such read requests received by a memory controller of the system are determined to be random read requests. This is because, in a multi-stream environment, the read requests of the applications are transmitted to the memory controller shuffled. The memory controller may receive a read request corresponding to a first address of one application and receive a read request corresponding to a first address of another application. The memory controller determines that these received read requests are random read requests because the read requests are processed without considering stream IDs S_ID. In this way, in the multi-stream environment in which multiple applications transmit read requests in real time, the memory controller determines that random read requests are received even if different applications transmit sequential read requests. Due to this processing, the overall operating speed of the memory system is deteriorated.

In contrast, in accordance with embodiments of the present disclosure, the memory controller 1200 may determine whether received read requests are sequential read requests based on the stream IDs. Accordingly, even in a multi-stream environment, the memory system 1000 may perform a read-look-ahead operation in response to the sequential read requests of respective applications which are transmitted from the host 2000. Accordingly, the operating speed of the memory system 1000 may be improved.

Figure 7:
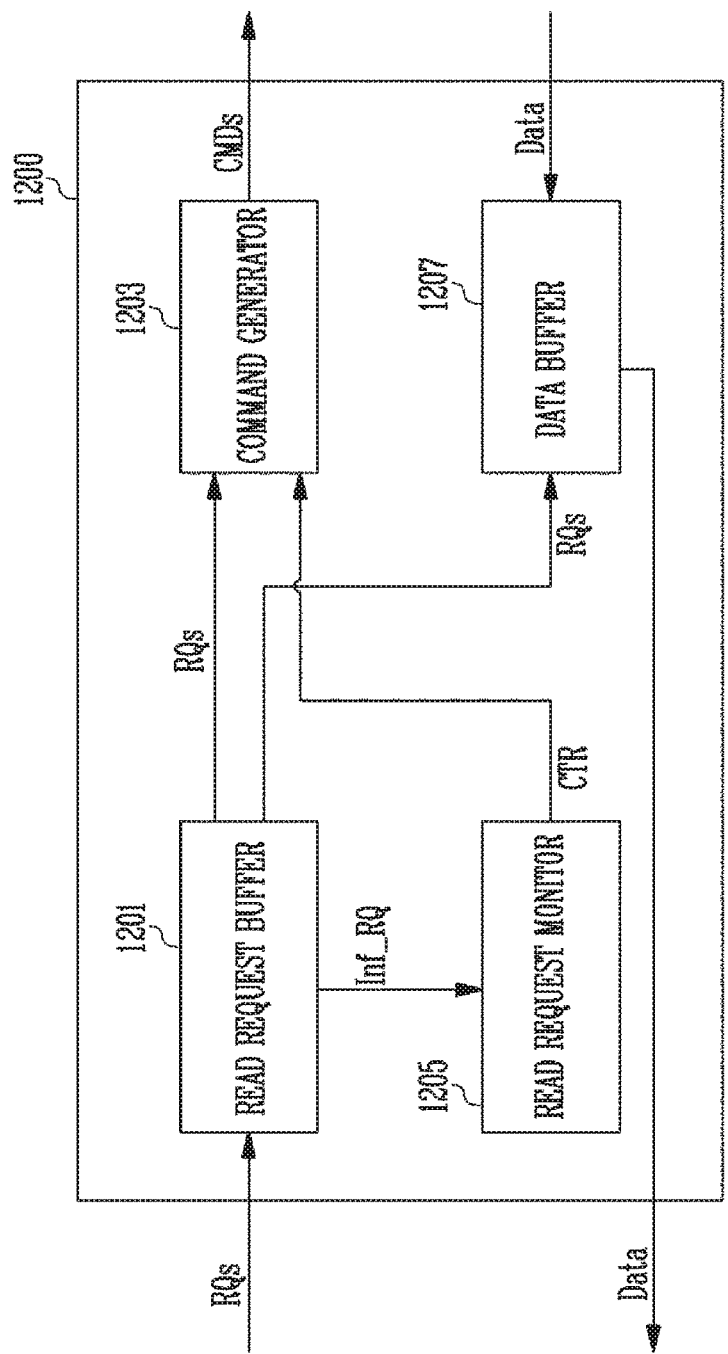
FIG. 7 is a block diagram illustrating a memory controller according to an embodiment of the present disclosure.

FIG. 7 is a block diagram illustrating a memory controller according to an embodiment of the present disclosure. Referring to FIG. 7, the memory controller 1200 may include a read request buffer 1201, a command generator 1203, a read request monitor 1205, and a data buffer 1207. This configuration shown in FIG. 7 is only an example. The memory controller 1200 may be configured differently than shown in FIG. 7.

The read request buffer 1201 may temporarily store read requests RQs received from the host 2000. The read request buffer 1201 may transfer the received read requests RQs to the command generator 1203. Further, the read request buffer 1201 may transfer read request information Inf_RQ about the received read requests RQs to the read request monitor 1205.

The command generator 1203 may generate a read command corresponding to the read requests RQs received from the read request buffer 1201. The command generator 1203 may generate a read command in response to a control signal CTR received from the read request monitor 1205. In an example, the read command generated in response to the control signal CTR received from the read request monitor 1205 may be a read command for a read-look-ahead (RLA) operation. The command generator 1203 may transfer the generated commands CMDs to the memory device 1100. The memory device 1100 may read data in response to the read command, among the received commands CMDs, and may transfer the read data to the memory controller 1200.

The read request monitor 1205 may receive the read request information Inf_RQ from the read request buffer 1201. The read request monitor 1205 may determine, based on the received read request information Inf_RQ, whether the corresponding read request is a sequential read request or a random read request. If it is determined that the corresponding read request is a sequential read request, the read request monitor 1205 may generate the control signal CTR for generating a command for executing a read-look-ahead operation, and may transfer the control signal CTR to the command generator 1203. As described above, the command generator 1203 may generate a read command for executing the read-look-ahead operation in response to the control signal CTR.

In an example, the read request monitor 1205 may count read requests having consecutive addresses for respective stream IDs, and may store the count results. Accordingly, the accumulated read requests may be counted for respective stream IDs, and thus it may be determined whether each received read request is a sequential read request or a random read request.

The data buffer 1207 may temporarily store data received from the memory device 1100. The data received from the memory device 1100 may be either data of a typical read operation, or data of a read-look-ahead operation. A typical read operation may be performed in response to a random read request. The read-look-ahead operation may be performed in response to a sequential read request. As described above, the read request monitor 1205 may determine, based on the received read request information Inf_RQ, whether the corresponding read request is a sequential read request or a random read request. When the data temporarily stored in the data buffer 1207 is data of a typical read operation, the corresponding data may be transmitted to the host 2000. When the data temporarily stored in the data buffer 1207 is data of a read-look-ahead operation, the data may be transferred to the host 2000 in response to the read requests RQs received from the read request buffer 1201.

A detailed operation of the memory controller 1200 illustrated in FIG. 7 will be described below with reference to FIGS. 8 and 9.

Figure 8:
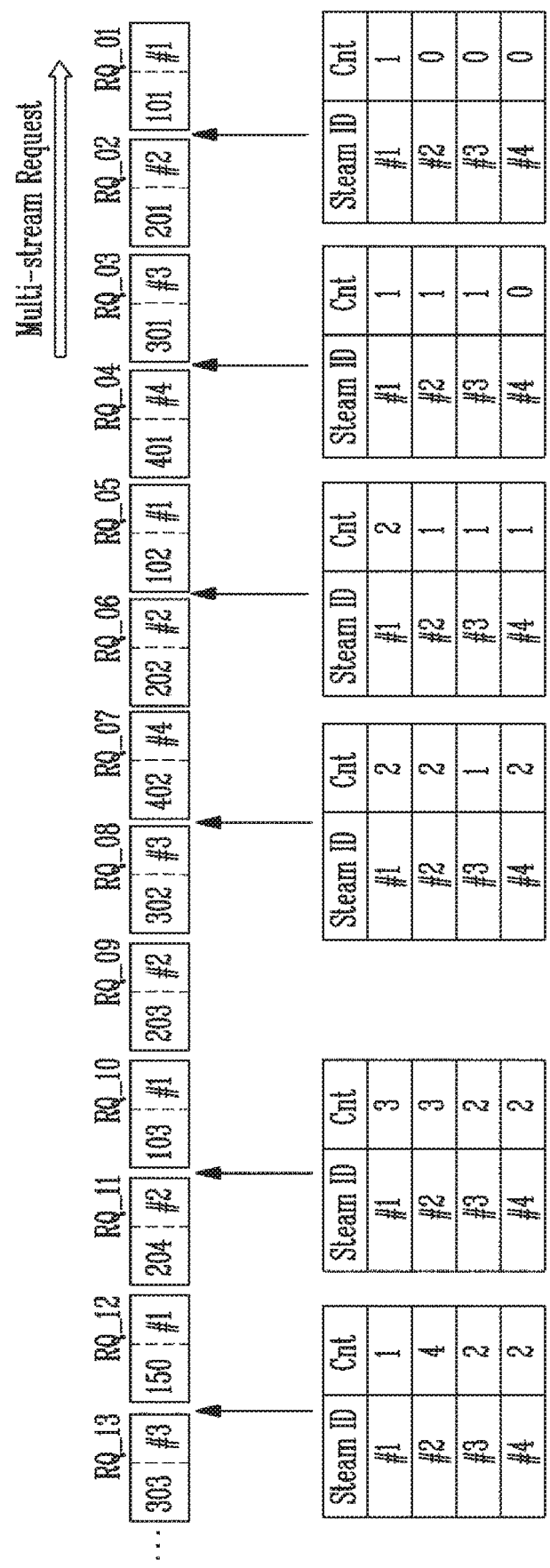
FIG. 8 is a diagram illustrating a method of operating a memory system according to an embodiment of the present disclosure.

FIG. 8 is a diagram illustrating a method of operating the memory system 1000 according to an embodiment of the present disclosure.

Referring to FIG. 8, read requests transferred from the host 2000 to the memory controller 1200 are illustrated. The corresponding requests may be multi-stream requests generated by different applications. In FIG. 8, first to 13-th requests RQ_01 to RQ_13 are illustrated. Each of the requests may have the format of the message 400, illustrated in FIG. 5, but all of the requests of FIG. 8 are regarded as read requests, and thus the illustration of the first field 401 is omitted. That is, among fields included in each read request, the second field 402 indicating the stream ID and the third field 403 indicating the address are illustrated in FIG. 8. The operation of the memory controller 1200 according to an embodiment of the present disclosure will be described in detail with reference to FIGS. 7 and 8 together.

A first request RQ_01 is generated by a first application and includes first stream ID #1. As illustrated in FIG. 8, when the first request RQ_01 is received in an initial state, a count value Cnt for the first stream ID #1 is increased by 1. Count values Cnt for second to fourth stream IDs #2, #3, and #4 are 0. These values may be counted by the read request monitor 1205.

Then, a second request RQ_02 and a third request RQ_03 are received. The second request RQ_02 and the third request RQ_03 include second stream ID #2 and third stream ID #3, respectively. Accordingly, count values Cnt for the second and third stream IDs #2 and #3 are also increased by 1. Next, a fourth request RQ_04 including fourth stream ID #4 is received, and then a count value Cnt for the fourth stream ID #4 is increased by 1.

A fifth request RQ_05 is received. The fifth request RQ_05 includes the first stream ID #1 and an address 102. An immediately previous request corresponding to the first stream ID #1 is the first request RQ_01, and the first request RQ_01 includes the address 101. Since the address 101 of the first request RQ_01 and the address 102 of the fifth request RQ_05 are consecutive addresses, the count value Cnt for the first stream ID #1 is increased by 1.

Then, a sixth request RQ_06 and a seventh request RQ_07 are received. The sixth request RQ_06 includes the second stream ID #2. An immediately previous request corresponding to the second stream ID #2 is the second request RQ_02 and includes the address 201. Since the address 202 of the sixth request RQ_06 and the address 201 of the second request RQ_02 are consecutive addresses, the count value Cnt for the second stream ID #2 is increased by 1 after the sixth request RQ_06 is received. Also, the seventh request RQ_07 includes the fourth stream ID #4. An immediately previous request corresponding to the fourth stream ID #4 is the fourth request RQ_04 and includes the address 401. Since the address 402 of the seventh request RQ_07 and the address 401 of the fourth request RQ_04 are consecutive addresses, the count value Cnt for the fourth stream ID #4 is increased by 1 after the seventh request RQ_07 is received.

In this way, when read requests for consecutive addresses are received for respective stream IDs #1 to #4, corresponding count values Cnt are respectively increased by 1.

A 12-th request RQ_12 is described below. The 12-th request RQ_12 includes the first stream ID #1 and an address 150. An immediately previous request corresponding to the first stream ID #1 is a tenth request RQ_10. The tenth request RQ_10 includes an address 103. Since the address 150 of the 12-th request RQ_12 and the address 103 of the tenth request RQ_10 are not consecutive addresses, the count value Cnt for the first stream ID #1 is initialized and designated as 1. That is, after the 12-th request RQ_12 is received, the count value Cnt for the first stream ID #1 is changed to 1 not 4. That is, the count value Cnt for each stream ID may be obtained by accumulating the number of times that read requests having consecutive addresses are successively received for each stream. The memory controller 1200 may determine, based on the count values Cnt for respective stream IDs #1 to #4, whether received read requests are sequential read requests or random read requests. Further, if it is determined that the corresponding received read request is a sequential read request, the memory controller 1200 may generate a command for a read-look-ahead operation and transfer the command to the memory device 1100. Accordingly, the efficiency of the read-look-ahead operation of the memory system 1000 may be improved, and the operating speed thereof may also be increased.

Figure 9:
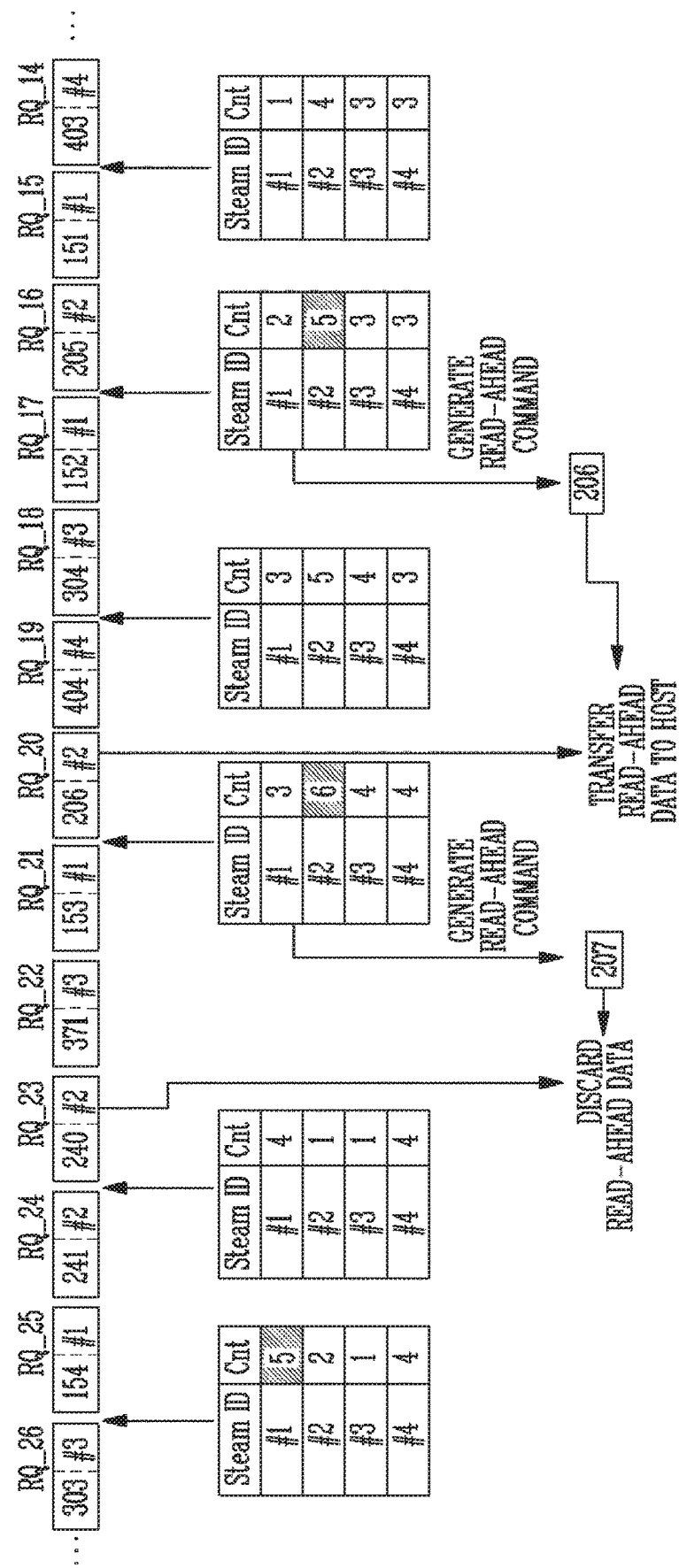
FIG. 9 is a diagram illustrating a method of operating a memory system according to an embodiment of the present disclosure.

FIG. 9 is a diagram illustrating a method of operating a memory system according to an embodiment of the present disclosure. Referring to FIG. 9, 14-th to 26-th requests RQ_14 to RQ_26, which are received subsequent to the 13-th request RQ_13, illustrated in FIG. 8, are illustrated. According to an example illustrated in FIG. 9, when the count value Cnt for each of the stream IDs #1 to #4 reaches "5", the memory controller 1200 may determine that a read request for the corresponding stream is a sequential read request, and may then generate a read-ahead command for the read-look-ahead operation. Below, steps for the reception of read requests will be described in detail.

A 14-th request RQ_14 includes a fourth stream ID #4 and an address 403. Referring to FIG. 8, an immediately previous request corresponding to the fourth stream ID #4 is the seventh request RQ_07, and the address 402 of the seventh request RQ_07 and the address 403 of the 14-th request RQ_14 are consecutive addresses, and thus the count value Cnt for the fourth stream ID #4 is increased by 1. However, since all of the count values Cnt for respective stream IDs #1 to #4 are less than 5 when the 14-th request RQ_14 is received, the memory controller 1200 determines that the read requests received to correspond to respective stream IDs #1 to #4 are random read requests.

Then, a 15-th request RQ_15 is received, and the count value Cnt for the first stream ID #1 is increased by 1. Then, a 16-th request RQ_16 is received, and the count value Cnt for the second stream ID #2 is increased by 1.

When the 16-th request RQ_16 is received, the count value Cnt for the second stream ID #2 reaches 5. As described above, in the example of FIG. 9, a reference count value Cnt that serves as a criterion for determining whether each received read request is a sequential read request is "5". Such reference count value Cnt that serves as the criterion for determining whether each received read request is a sequential read request is referred to as a "first threshold". That is, in the example of FIG. 9, the first threshold may be 5 (this number may be changed depending on system design), so that when the 16-th request RQ_16 is received, the count value Cnt for the second stream ID #2 reaches the first threshold. Accordingly, the memory controller 1200 determines that the read request for the second stream ID #2 is a sequential read request. Accordingly, a read-ahead command is generated for the read-look-ahead operation.

More specifically, the read request monitor 1205 of FIG. 7 transfers the control signal CTR to the command generator 1203 because the count value Cnt for the second stream ID #2 has reached the first threshold, "5" in this example. The command generator 1203 generates a read-ahead command for the second stream ID #2 in response to the control signal CTR.

Since the address of the received 16-th request RQ_16 is "205", the command generator 1203 generates the read-ahead command for a read-look-ahead operation for the address 206, and transfers the command to the memory device 1100. Accordingly, the data corresponding to the address 206 from the memory device 1100 may be temporarily stored in the data buffer 1207 of the memory controller 1200.

Then, as 17-th to 19-th requests RQ_17 to RQ_19 are received, count values Cnt for the first stream ID #1, the third stream ID #3, and the fourth stream ID #4 are respectively increased by 1.

A 20-th request RQ_20 is received. The 20-th request RQ_20 includes the second stream ID #2 and an address 206. As the 20-th request RQ_20 including the address 206 is received, the data temporarily stored in the data buffer 1207 through a read-look-ahead operation is transferred to the host 2000. In this case, by means of the read-look-ahead operation, the length of time from when the memory controller 1200 receives the 20-th request RQ_20 to when the corresponding data is transferred to the host 2000 may be reduced. Accordingly, the operating speed of the memory system 1000 may be improved.

As the 20-th request RQ_20 is received, the count value Cnt for the second stream ID #2 is increased by 1 to reach 6. Since the count value Cnt for the second stream ID #2 is still greater than the first threshold, the memory controller 1200 determines that the read request for the second stream ID #2 is a sequential read request. Accordingly, a read-ahead command is generated for the read-look-ahead operation for the second stream ID #2. That is, the read request monitor 1205 of FIG. 7 transfers the control signal CTR to the command generator 1203, and the command generator 1203 generates a read-ahead command for the second stream ID #2 in response to the control signal CTR. Since the address of the received 20-th request RQ_20 is "206", the command generator 1203 generates a command for a read-look-ahead operation for an address 207 and transfers the command to the memory device 1100. Accordingly, data corresponding to the address 207 from the memory device 1100 may be temporarily stored in the data buffer 1207 of the memory controller 1200.

Then, as a 21-st request RQ_21 is received, the count value Cnt for the first stream ID #1 is increased by 1. As a 22-nd request RQ_22 is received, the count value Cnt for the third stream ID #3 is initialized and changed to 1. The reason for this is that the address 371 of the 22-nd request RQ_22 is not consecutive to the address 304 of an 18-th request RQ_18, which is an immediately previous request corresponding to the third stream ID #3. Therefore, the memory controller 1200 may still determine that the read request for the third stream ID #3 is a random read request.

Then, a 23-rd request RQ_23 is received. The 23-rd request RQ_23 includes the second stream ID #2 and an address 240. An immediately previous request corresponding to the second stream ID #2 is the 20-th request RQ_20. Since the address 206 of the 20-th request RQ_20 and the address 240 of the 23-rd request RQ_23 are not consecutive addresses, the count value Cnt for the second stream ID #2 is initialized and changed to 1.

The address 240 of the 23-rd request RQ_23 including the second stream ID #2 is not address 207 of read-ahead (i.e., prefetched) data that is temporarily stored in the data buffer 1207 through a read-look-ahead operation. Therefore, the data corresponding to the address 207, which is temporarily stored in the data buffer 1207 through the read-look-ahead operation, is discarded without being transferred to the host 2000.

Then, a 24-th request RQ_24 is received, and thus the count value Cnt for the second stream ID #2 is increased by 1. Further, a 25-th request is received, and thus the count value Cnt for the first stream ID #1 is increased by 1 to reach the first threshold. Although not illustrated in FIG. 9, the memory controller 1200 may generate a command for performing a read-look-ahead operation on data corresponding to an address 155, and may transfer the command to the memory device 1100.

Although, in the embodiments of FIGS. 8 and 9, the first threshold has been described as being 5, this is only an example, and the embodiments of the present disclosure are not limited thereto. That is, if necessary, the first threshold may be set to a value of other than 5 based on system design considerations. When the first threshold is set to a large value, the amount of data to be discarded due to an unnecessary read-look-ahead operation may be reduced. That is, when the first threshold is set to a large value, the write amplification factor (WAF) of the memory device 1100 attributable to an unnecessary read-look-ahead operation may be decreased. Conversely, when the first threshold is set to a small value, the frequency of the read-look-ahead operation may be increased, with the result that the operating speed of the memory system 1000 may be improved.

In this way, in accordance with embodiments of the present disclosure, the memory controller 1200 may monitor received read requests for respective stream IDs, and may determine whether the read requests are sequential read requests. Accordingly, sequential read requests may be determined and read-look-ahead operations may be performed even in a situation in which read requests are shuffled and transmitted for respective streams in a multi-stream environment. Accordingly, the operating speed of the memory system 1000 may be improved.

Figure 10:
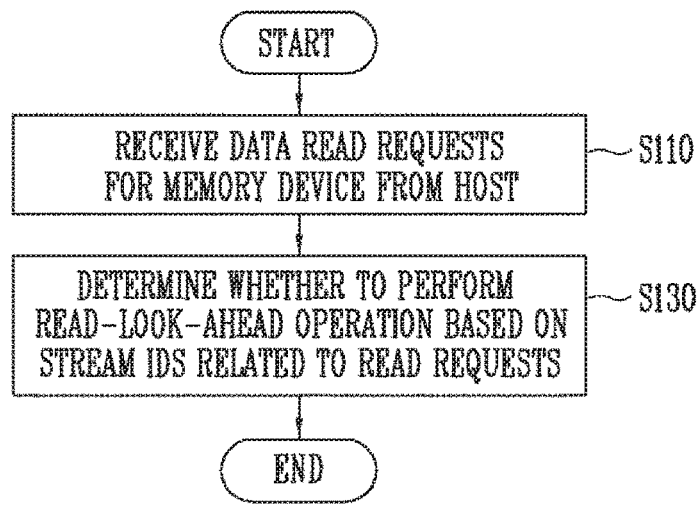
FIG. 10 is a flowchart describing a method of operating a memory system according to an embodiment of the present disclosure.

FIG. 10 is a flowchart describing a method of operating a memory system according to an embodiment of the present disclosure.

Referring to FIG. 10, the method of operating the memory system 1000 according to an embodiment of the present disclosure may include the step S110 of receiving data read requests for the memory device 1100 from the host 2000, and the step S130 of determining, based on stream IDs related to the read requests, whether to perform a read-look-ahead operation.

As an example, at step S110 of receiving the data read requests for the memory device 1100 from the host 2000, read requests RQ1 to RQ4 generated by respective applications App.1 to App.4 in a multi-stream environment may be shuffled and transferred to the memory controller 1200, as described above with reference to FIG. 6. In typical cases, since the read requests RQ1 to RQ4 are shuffled and received, it is impossible to determine whether the read requests are sequential read requests. However, in accordance with the method of operating the memory system 1000 according to an embodiment of the present disclosure, whether the read requests are sequential read requests may be determined for respective stream IDs.

The step S130 of determining, based on the stream IDs related to the read requests, whether to perform a read-look-ahead operation may be configured to count stream IDs corresponding to respective read requests and to determine whether the read requests are sequential read requests, as described above with reference to FIGS. 7 to 9. If it is determined that each of the read requests is a sequential read request, the read-look-ahead operation is performed, and thus the operating speed of the memory system 1000 may be improved.

Steps S110 and S130 illustrated in FIG. 10 may be performed by the memory controller 1200 whenever one read request is received. Therefore, after step S130 has been performed, step S110 is performed again.

Detailed configuration of step S130 of determining, based on stream IDs related to the read requests, whether to perform a read-look-ahead operation will be described below with reference to FIG. 11.

Figure 11:
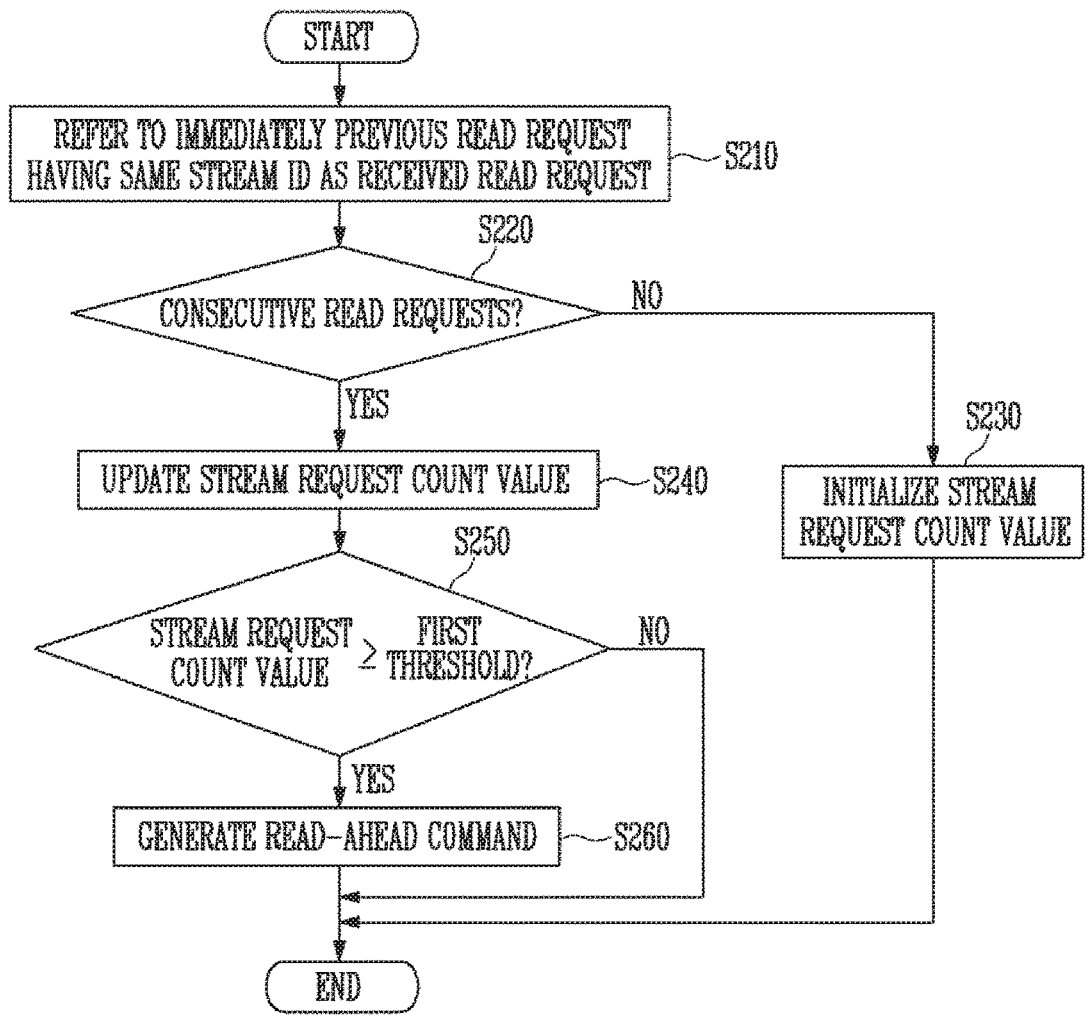
FIG. 11 is a flowchart describing a step of determining whether to perform a read-look-ahead operation in FIG. 10 according to an embodiment of the present disclosure.

FIG. 11 is a flowchart describing the step of determining whether to perform a read-look-ahead operation in FIG. 10 in accordance with an embodiment of the present disclosure.

Referring to FIG. 11, the step S130 of determining whether to perform a read-look-ahead operation may include steps S210, S220, S230, S240, S250, and S260.

At step S210, an immediately previous read request having the same stream ID as the received read request is referred to. In an example, when the seventh request RQ_07 is received in FIG. 8, the fourth request RQ_04, which is an immediately previous request having the stream ID #4 of the seventh request RQ_07, is referred to.

Then, at step S220, it is determined whether the received read request is a read request consecutive to that of the corresponding stream ID. In the above example, when the seventh request RQ_07 is received, whether the seventh request RQ_07 is a read request consecutive to the fourth request RQ_04 is determined by referring to the addresses of the read requests. Since the address of the seventh request RQ_07 is 402 and the address of the fourth request RQ_04 is 401, the requests are consecutive read requests. Therefore, in this case, the process proceeds to step S240. Conversely, when the 12-th request RQ_12 is received, the address 150 thereof is not consecutive to the address 103 of the tenth request RQ_10, and thus it is determined that the requests are not consecutive read requests. In this case, the process proceeds to step S230. When the process proceeds to step S230, the count value Cnt for the stream request (i.e., the request of the stream ID) is initialized and changed to 1, and then the process is terminated.

At step S240, the count value Cnt for the stream request is updated. The update may indicate increasing the count value Cnt by 1. Thereafter, whether the updated count value Cnt is equal to or greater than a first threshold is determined.

For example, when the 16-th request RQ_16 is received in FIG. 9, the count value Cnt for the second stream ID #2, which is updated at step S240, is 5. Further, since the first threshold is 5, the process may proceed to step S260 based on the result of determination at step S250. Conversely, when the 15-th request RQ_15 is received in FIG. 9, the count value Cnt for the first stream ID #1, which is updated at step S240, is 2. Since the updated count value is less than the first threshold, the step S130 of determining whether to perform a read-look-ahead operation may be terminated based on the result of determination at step S250.

When the process proceeds to step S260, a read-ahead command is generated. For example, when the 16-th request RQ_16 is received in FIG. 9, the address of the 16-th request RQ_16 is 205, and thus a read-ahead command for an address 206 may be generated and transferred to the memory device 1100.

When all steps illustrated in FIG. 11 are performed, step S110 of FIG. 10 is repeated.

In accordance with the method of operating the memory system 1000 illustrated in FIGS. 10 and 11, whether received read requests are sequential read requests may be determined for respective stream IDs even if read requests for various streams are shuffled and transferred from the host 2000 to the memory controller 1200 in a multi-stream environment. Accordingly, a read-look-ahead operation may be more efficiently performed, and thus the operating speed of the memory system may be improved.

Figure 12:
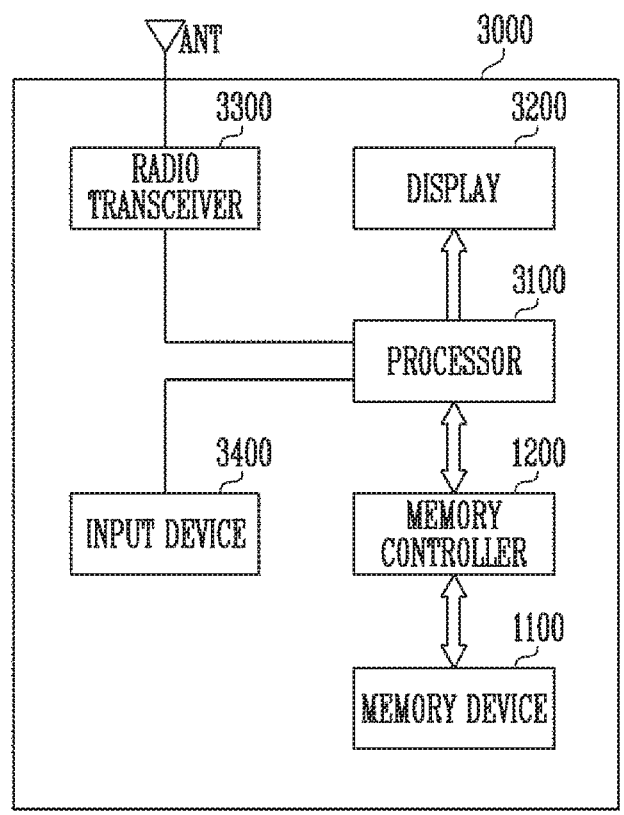
FIGS. 12 to 15 are diagrams illustrating various application examples of a memory system including the memory controller of FIG. 7.

FIG. 12 is a diagram illustrating an application example of a memory system including the memory controller of FIG. 7.

Referring to FIG. 12, a memory system 3000 may be embodied in a cellular phone, a smartphone, a tablet PC, a personal digital assistant (PDA) or a wireless communication device. The memory system 3000 may include the memory device 1100 and a memory controller 1200 capable of controlling the operation of the memory device 1100. The memory controller 1200 may control a data access operation, e.g., a program, erase, or read operation, of the memory device 1100 under the control of a processor 3100.

Data programmed in the memory device 1100 may be output through a display 3200 under the control of the memory controller 1200.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 1200, data output from the radio transceiver 3300, or data output from the input device 3400 is output through the display 3200.

In an embodiment, the memory controller 1200 capable of controlling the operation of the memory device 1100 may be implemented as a part of the processor 3100 or a chip provided separately from the processor 3100.

Figure 13:
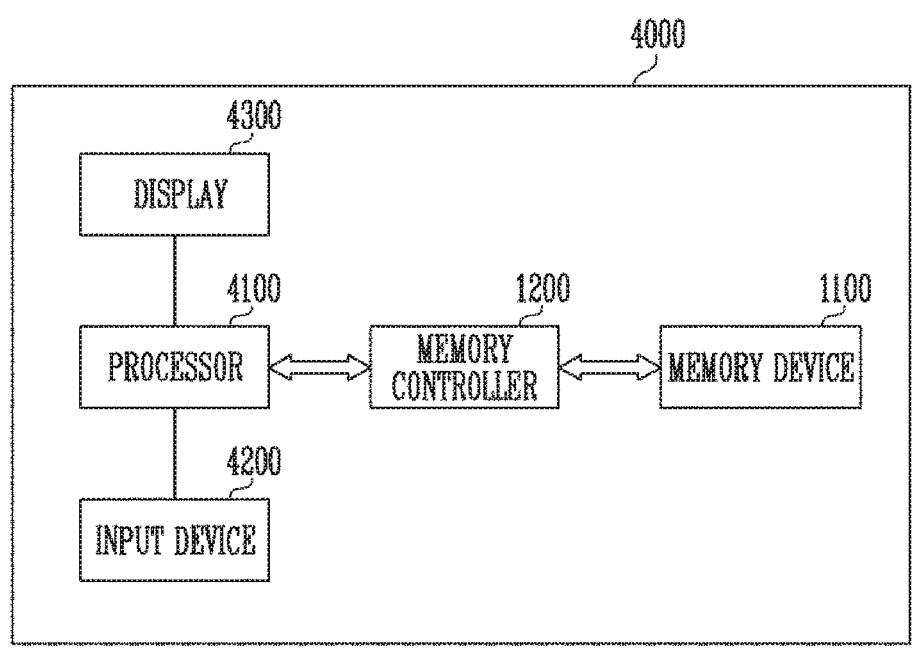

FIG. 13 is a diagram illustrating an application example of the memory system including the memory controller illustrated in FIG. 7.

Referring to FIG. 13, a memory system 4000 may be embodied in a personal computer, a tablet PC, a net-book, an e-reader, a personal digital assistant (PDA), a portable multimedia player (PMP), an MP3 player, or an MP4 player.

The memory system 4000 may include the memory device 1100 and a memory controller 1200 capable of controlling the data processing operation of the memory device 1100.

A processor 4100 may output data stored in the memory device 1100 through a display 4300, according to data input from an input device 4200. For example, the input device 4200 may be implemented as a point device such as a touch pad or a computer mouse, a keypad or a keyboard.

The processor 4100 may control the overall operation of the memory system 4000 and control the operation of the memory controller 1200. In an embodiment, the memory controller 1200 capable of controlling the operation of the memory device 1100 may be implemented as a part of the processor 4100 or a chip provided separately from the processor 4100.

Figure 14:
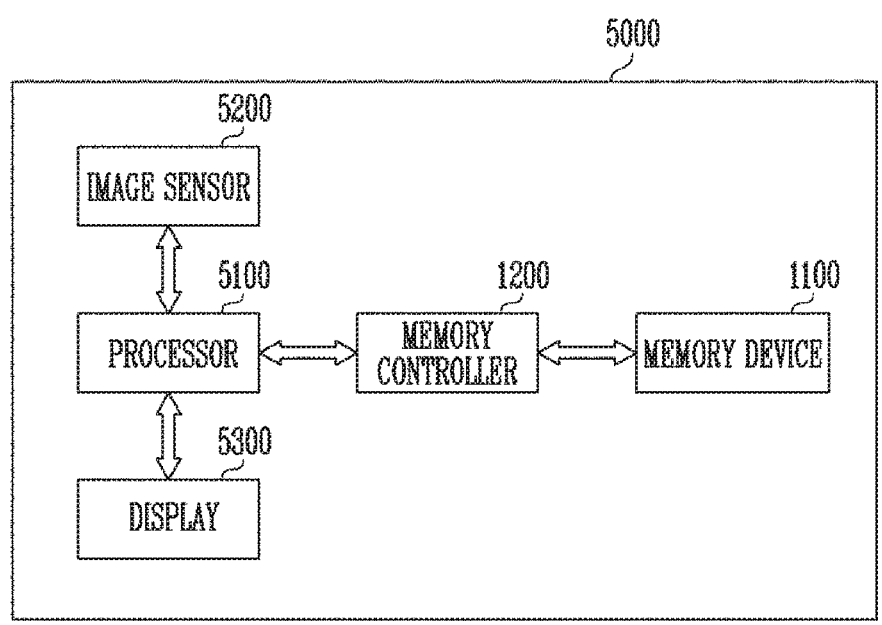

FIG. 14 is a diagram illustrating application example of the memory system including the memory controller illustrated in FIG. 7.

Referring to FIG. 14, a memory system 5000 may be embodied in an image processing device, e.g., a digital camera, a portable phone provided with a digital camera, a smartphone provided with a digital camera, or a tablet PC provided with a digital camera.

The memory system 5000 may include the memory device 1100 and a memory controller 1200 capable of controlling a data processing operation, e.g., a program, erase, or read operation, of the memory device 1100.

An image sensor 5200 of the memory system 5000 may convert an optical image into digital signals. The converted digital signals may be transmitted to a processor 5100 or the memory controller 1200. Under the control of the processor 5100, the converted digital signals may be output through a display 5300 or stored in the memory device 1100 through the memory controller 1200. Data stored in the memory device 1100 may be output through the display 5300 under the control of the processor 5100 or the memory controller 1200.

In an embodiment, the memory controller 1200 capable of controlling the operation of the memory device 1100 may be implemented as a part of the processor 5100, or a chip provided separately from the processor 5100.

Figure 15:
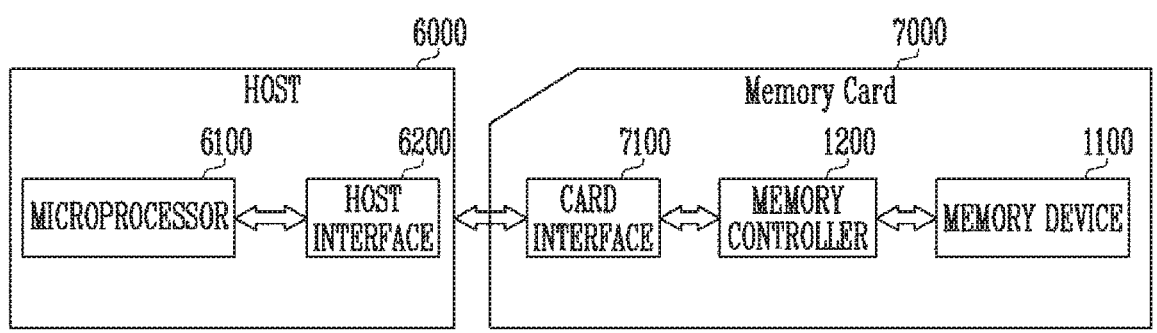

FIG. 15 is a diagram illustrating an application example of the memory system including the memory controller, illustrated in FIG. 7.

Referring to FIG. 15, a memory system 7000 may be embodied in a memory card or a smart card. The memory system 7000 may include the memory device 1100, a memory controller 1200 and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 6000 and the memory controller 1200 according to a protocol of the host 6000. In an embodiment, the card interface 7100 may support a universal serial bus (USB) protocol, and an inter-chip (IC)-USB protocol. Here, the card interface may refer to hardware capable of supporting a protocol which is used by the host 6000, software installed in the hardware, or a signal transmission method.

When the memory system 7000 is connected to a host interface 6200 of the host 6000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100.

In accordance with embodiments of the present disclosure, a memory controller, which can improve the operating speed of a memory system, is provided.

In accordance with embodiments of the present disclosure, a memory system having an improved operating speed is provided.

In accordance with embodiments of the present disclosure, a method of operating a memory system having an improved operating speed is provided.

Various embodiments have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory controller for controlling an operation of a memory device, comprising:
   a read request buffer configured to receive a read request including a stream ID from a host;
   a command generator configured to receive the read request from the read request buffer and generate a read command based on the read request; and
   a read request monitor configured to receive read request information about the read request from the read request buffer and determine, based on the stream ID of the read request, whether the read request is a sequential read request with respect to an immediately previous read request having the same stream ID as the read request.

2. The memory controller according to claim 1, wherein the stream ID represents that the read request is generated by one of a plurality of applications executed by the host.

3. The memory controller according to claim 1, wherein the read request monitor is configured to, when the read request is determined to be the sequential read request, generate a control signal for controlling the command generator to generate a read-ahead command.

4. The memory controller according to claim 3, wherein the command generator is configured to transfer the read-ahead command to the memory device in response to the control signal, wherein the read-ahead command is configured to perform a read-look-ahead operation on data corresponding to an address consecutive to an address of the read request.

5. The memory controller according to claim 4, further comprising a data buffer configured to store the data of the read-look-ahead operation.

6. A memory system, comprising:
a memory device configured to include a plurality of memory cells to store data; and
a memory controller configured to control an operation of the memory device,
wherein the memory controller is configured to receive a plurality of read requests, each including a stream ID, and determine, based on the stream IDs, whether a currently read request of the plurality of read requests is a sequential read request with respect to an immediately previous read request having the same stream ID as the currently read request.

7. The memory system according to claim 6, wherein, when the currently read request is determined to be the sequential read request, a read-look-ahead operation is performed.

8. The memory system according to claim 6, wherein the memory controller is configured to:
compare an address of the immediately previous read request, which includes the same stream ID as the currently received read request, with an address of the currently received read request, and update a count value denoting a number of read requests having consecutive addresses corresponding to the same stream ID, and
determine that the currently received read request is a sequential read request when the count value is equal to or greater than a first threshold.

9. The memory system according to claim 8, wherein the memory controller increases the count value by 1 when the address of the immediately previous read request, which includes the same stream ID as the currently received read request, and the address of the currently received read request are consecutive addresses.

10. The memory system according to claim 8, wherein the memory controller initializes the count value when the address of the immediately previous read request, which includes the same stream ID as the currently received read request, and the address of the currently received read request are not consecutive addresses.

11. The memory system according to claim 8, wherein, when the currently received read request is determined to be the sequential read request, the memory system performs a read-look-ahead operation on data stored at an address consecutive to the address of the currently received read request.

12. A method of operating a memory system, comprising:
receiving a data read request for a memory device from a host; and
determining, based on a stream ID included in the data read request, whether to perform a read-look-ahead operation.

13. The method according to claim 12, wherein determining whether to perform the read-look-ahead operation comprises:
updating a count value denoting a number of read requests having consecutive addresses corresponding to the stream ID by referring to an immediately previous read request having a stream ID identical to that of the data read request;
determining whether the updated count value is equal to or greater than a first threshold; and
performing the read-look-ahead operation based on a result of determination.

14. The method according to claim 13, wherein updating the count value comprises comparing an address of the immediately previous read request including the stream ID with an address of the data read request, and then updating the count value.

15. The method according to claim 14, wherein updating the count value comprises increasing the count value by 1 when the address of the immediately previous read request and the address of the data read request are consecutive addresses.

16. The method according to claim 14, wherein updating the count value comprises initializing the count value when the address of the immediately previous read request and the address of the data read request are not consecutive addresses.

17. The method according to claim 13, wherein performing the read-look-ahead operation based on the result of determination comprises:
performing the read-look-ahead operation when the updated count value is equal to or greater than a first threshold.

18. A memory system comprising:
a memory device; and
a controller configured to:
determine a current read request including a stream ID, which represents the current read request is generated by one of a plurality of applications executed by a host, as a sequential read request based on the stream ID and a read address included in the current read request; and
perform a read-look-ahead operation on the memory device based on a number of sequential read requests, and
wherein the controller determines the current read request as the sequential read request when the read address of current read request is consecutive to that of an immediately previous read request having the same stream ID as the current read request.

19. The memory system of claim 18,
wherein the controller controls, during the read-look-ahead operation, the memory device to read data corresponding to the read address consecutively subsequent to that of the current read request, and
wherein the controller buffers the read data.

20. The memory system of claim 19, the controller provides, during the read-look-ahead operation, the buffered data to the host when the controller determines a read request subsequent to the current read request as the sequential read request having the information of the same stream ID as the current read request.

* * * * *